United States Patent
Leidel

(10) Patent No.: US 10,126,947 B2
(45) Date of Patent: Nov. 13, 2018

(54) INTERCONNECT SYSTEMS AND METHODS USING HYBRID MEMORY CUBE LINKS TO SEND PACKETIZED DATA OVER DIFFERENT ENDPOINTS OF A DATA HANDLING DEVICE

(71) Applicant: Micron Technology, Inc., Boise, ID (US)

(72) Inventor: John D. Leidel, McKinney, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/413,732

(22) Filed: Jan. 24, 2017

(65) Prior Publication Data
US 2017/0131915 A1   May 11, 2017

Related U.S. Application Data

(62) Division of application No. 14/273,867, filed on May 9, 2014, now Pat. No. 9,558,143.

(51) Int. Cl.
*G06F 13/00* (2006.01)
*G06F 3/06* (2006.01)
(Continued)

(52) U.S. Cl.
CPC .......... *G06F 3/0607* (2013.01); *G06F 3/0659* (2013.01); *G06F 3/0685* (2013.01);
(Continued)

(58) Field of Classification Search
CPC ............... G06F 3/0607; G06F 13/4022; G06F 13/1621; G06F 3/0685; G06F 3/0659; G11C 7/1075; G11C 21/00
(Continued)

(56) References Cited

U.S. PATENT DOCUMENTS

| 5,448,511 A | 9/1995 | Paurus et al. |
| 5,541,914 A | 7/1996 | Krishnamoorthy et al. |

(Continued)

FOREIGN PATENT DOCUMENTS

| JP | 06187299 A | 7/1994 |
| JP | 2000235558 A | 8/2000 |

(Continued)

OTHER PUBLICATIONS

Hybrid Memory Cube Specification 1.1, Hybrid Memory Cube Consortium, Feb. 2014, entire pages (123 pages).
(Continued)

*Primary Examiner* — Hong C Kim
(74) *Attorney, Agent, or Firm* — TraskBritt

(57) ABSTRACT

System on a Chip (SoC) devices include two packetized memory buses for conveying local memory packets and system interconnect packets. In an in-situ configuration of a data processing system two or more SoCs are coupled with one or more hybrid memory cubes (HMCs). The memory packets enable communication with local HMCs in a given SoC's memory domain. The system interconnect packets enable communication between SoCs and communication between memory domains. In a dedicated routing configuration each SoC in a system has its own memory domain to address local HMCs and a separate system interconnect domain to address HMC hubs, HMC memory devices, or other SoC devices connected in the system interconnect domain.

18 Claims, 8 Drawing Sheets

(51) Int. Cl.
  *G06F 13/42* (2006.01)
  *G06F 13/16* (2006.01)
  *G06F 13/40* (2006.01)
  *G11C 7/10* (2006.01)
  *G11C 21/00* (2006.01)

(52) U.S. Cl.
  CPC ...... *G06F 13/1621* (2013.01); *G06F 13/1657* (2013.01); *G06F 13/1673* (2013.01); *G06F 13/1684* (2013.01); *G06F 13/40* (2013.01); *G06F 13/4022* (2013.01); *G06F 13/4234* (2013.01); *G11C 7/1075* (2013.01); *G11C 21/00* (2013.01); *G06F 2212/205* (2013.01)

(58) Field of Classification Search
  USPC .............................................. 711/170, 118, 5
  See application file for complete search history.

(56) References Cited

U.S. PATENT DOCUMENTS

| | | | |
|---|---|---|---|
| 5,563,086 | A | 10/1996 | Bertin et al. |
| 6,970,968 | B1 | 11/2005 | Holman |
| 7,584,335 | B2 | 9/2009 | Daniels |
| 8,397,013 | B1 | 3/2013 | Rosenband et al. |
| 9,065,722 | B2 | 6/2015 | Thottethodi et al. |
| 9,092,305 | B1 | 7/2015 | Blott et al. |
| 2004/0088522 | A1 | 5/2004 | Watson et al. |
| 2010/0165692 | A1 | 7/2010 | Jeddeloh |
| 2010/0238693 | A1 | 9/2010 | Jeddeloh |
| 2010/0303079 | A1 | 12/2010 | Singhal et al. |
| 2011/0219197 | A1 | 9/2011 | Perego et al. |
| 2012/0106228 | A1 | 5/2012 | Lee |
| 2013/0022201 | A1 | 1/2013 | Glew et al. |
| 2013/0326090 | A1 | 12/2013 | Gillingham |
| 2014/0013129 | A1 | 1/2014 | de Rochemont et al. |
| 2014/0013132 | A1 | 1/2014 | de Rochemont et al. |
| 2014/0025923 | A1 | 1/2014 | Klein |
| 2014/0082234 | A1 | 3/2014 | Gopalakrishnan et al. |
| 2014/0122634 | A1* | 5/2014 | Conner ............... G06F 13/4027 709/212 |
| 2015/0012717 | A1* | 1/2015 | Murphy ................ G11C 7/22 711/167 |
| 2015/0324285 | A1 | 11/2015 | Murphy et al. |
| 2015/0324319 | A1 | 11/2015 | Leidel |

FOREIGN PATENT DOCUMENTS

| | | |
|---|---|---|
| JP | 2003076670 A | 3/2003 |
| JP | 2006518885 A | 8/2006 |

OTHER PUBLICATIONS

International Search Report for International Patent Application No. PCT/US2015/028873, dated Aug. 17, 2015, 3 pages.
Written Opinion for International Patent Application No. PCT/US2015/028873, dated Aug. 17, 2015, 7pages.
Taiwan Search Report from Taiwan Patent Application No. 104114796, dated Oct. 25, 2016, 1 page.
European Search Report, dated Nov. 28, 2017, and Written Opinion, dated Dec. 6, 2017, for European Application No. 15789012.0, 7 pages.
PCI-SIG: "PCI Express Base Specification Revision 1.1", PCI Express, (Mar. 2005) 54 pages.
Japanese Office Action from Japanese Application No. 2016-566810, dated Jan. 9, 2018, 14 pages with English translation.
Notice of Reasons for Rejection from Korean Application No. 10-2016-7034480, dated Nov. 21, 2017, 8 pages with English translation.
Japanese Notice of Rejection Grounds from Japanese Application No. 2016-566810, dated Aug. 31, 2018, 12 pages.

\* cited by examiner

INTERCONNECT SYSTEMS AND METHODS USING HYBRID MEMORY CUBE LINKS TO SEND PACKETIZED DATA OVER DIFFERENT ENDPOINTS OF A DATA HANDLING DEVICE

CROSS-REFERENCE TO RELATED APPLICATION

This application is a divisional of U.S. patent application Ser. No. 14/273,867, filed May 9, 2014, now U.S. Pat. No. 9,558,143, issued Jan. 31, 2017 the disclosure of which is hereby incorporated herein in its entirety by this reference.

TECHNICAL FIELD

The present disclosure relates generally to interconnection of devices and related methods, such as semiconductor memory devices, processing devices, memory systems, and processing systems. More particularly, the present disclosure relates to interconnection of such devices and systems using Hybrid Memory Cube links.

BACKGROUND

Memory devices are typically provided in many data processing systems as semiconductor integrated circuits and/or external removable devices in computers or other electronic devices. There are many different types of memory including Random Access Memory (RAM), Read Only Memory (ROM), Dynamic Random Access Memory (DRAM), Synchronous DRAM (SDRAM), flash memory, and resistance variable memory, among others.

Conventional memory systems typically consist of one or more memory devices, such as DRAMs, mounted on a Printed Circuit Board (PCB) called a Dual In-line Memory Module (DIMM). The memory system is in communication with a memory control subsystem or central processing unit (CPU) or microprocessor. In some configurations, the memory controller is physically subsumed into the same physical chip as the processor. In other configurations the memory controller may be just one of many logical components comprising a memory controller hub. A memory controller hub typically supports completely separate and distinct memory address spaces, often using different types of semiconductor memory or different purposes. For example, a memory controller may support the use of video DRAM for graphics applications, flash memory for disk-drive acceleration, and commodity DRAM as the processor's main external memory.

The limitations imposed by memory protocols, traditional memory subsystem architectures, standards, processor-specific memory access models, end-user configurability requirements, power constraints, or combinations of those limitations tend to interact in such a manner that reduce performance and result in non-optimal memory subsystems. Recently, Memory Control Hubs (MCHs) have been proposed to enhance memory performance between processors and memory subsystems. However, MCHs are defined primarily as a memory subsystem for a single processor. Many general purpose system architectures include multiple processors, each possibly with their own memory domain. Often these multiple processors need to communicate between themselves. As a result, private processor communication buses have been proposed to enhance system interconnection.

However, the current generation of general purpose system interconnect specifications do not provide sufficient functionality, flexibility and performance necessary to maintain appropriate balance in systems whose main memory is based upon high bandwidth devices such as are proposed with the HMC specification. It is often the case to find system architectures that maintain many hundreds of gigabytes per second of access to local memory bandwidth, but provide a small fraction (on the order of $\frac{1}{10}^{th}$) of this bandwidth to the system interconnect. This result is a highly imbalanced system.

This phenomenon is especially evident in applications with multiple threads (e.g., tasks) of execution distributed among multiple processing sockets/devices. If the core processor supports functional data caching, the cache coherency mechanism that must be present between the processor sockets must support a local memory bandwidth that may be an order of magnitude larger than the bandwidth on the system interconnect. The result is a highly imbalanced system.

There is a need for interconnect systems and methodologies that provide more balanced system bandwidth and can also reduce the complexity needed to design such interconnect systems.

DETAILED DESCRIPTION

Figure 1:
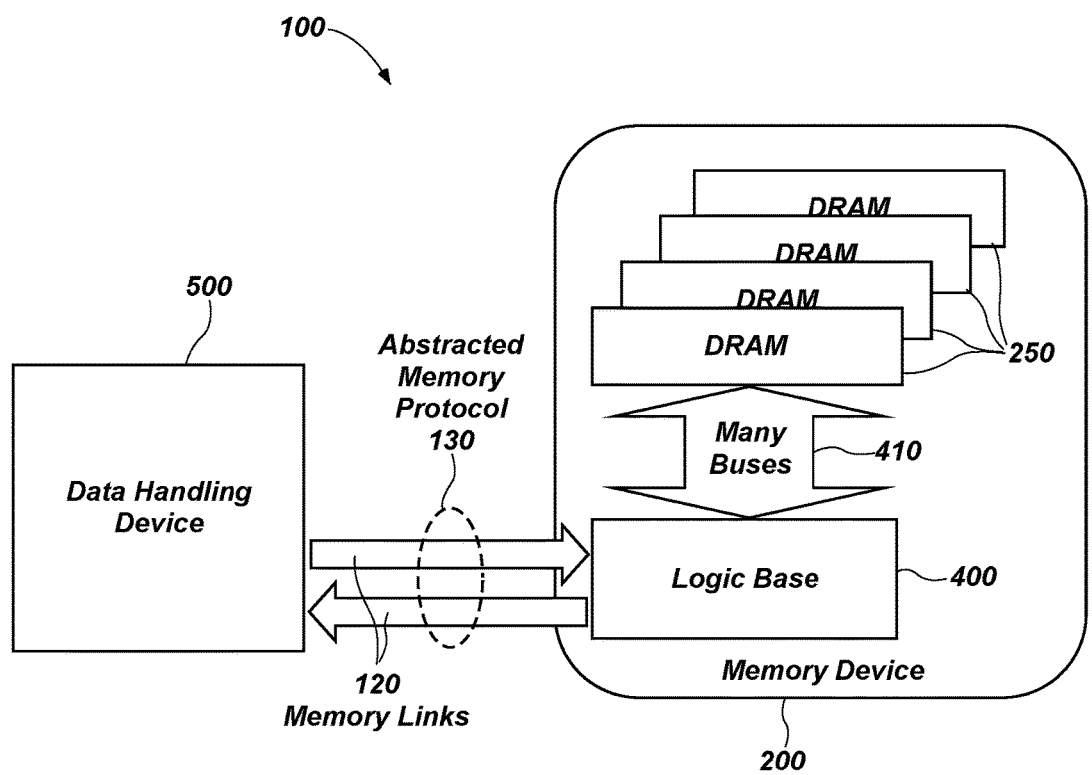
FIG. 1 is a diagram of a data processing system including a hybrid memory cube as an example of a device for operation on a memory bus using an abstracted memory protocol.

In the following detailed description, reference is made to the accompanying drawings, which form a part hereof, and in which are shown, by way of illustration, specific example embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure. The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

Elements, circuits, modules, and functions may be shown in block diagram form in order not to obscure the present disclosure in unnecessary detail. Moreover, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill would appreciate that the various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and acts are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments described herein.

When implemented with hardware, the embodiments disclosed herein may be implemented or performed with a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. When executing software for carrying out processes for embodiments described herein, a general-purpose processor should be considered a special-purpose processor configured for carrying out such processes. A processor may also be implemented as a combination of computing devices, e.g., a combination of a DSP and a microprocessor, a plurality of microprocessors, one or more microprocessors in conjunction with a DSP core, or any other such configuration.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions or code on a computer-readable medium. Computer-readable media includes both computer storage media and communication media including any medium that facilitates transfer of a computer program from one place to another.

Those of ordinary skill in the art will understand that information and signals may be represented using any of a variety of different technologies and techniques. For example, data, instructions, commands, information, signals, bits, symbols, and chips that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus for carrying the signals, wherein the bus may have a variety of bit widths.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

Elements described herein may include multiple instances of the same element. These elements may be generically indicated by a numerical designator (e.g., 110) and specifically indicated by the numerical indicator followed by an alphabetic designator (e.g., 110A) or a numeric indicator preceded by a "dash" (e.g., 110-1). For ease of following the description, for the most part element number indicators begin with the number of the drawing on which the elements are introduced or most fully discussed. Thus, for example, element identifiers on a FIG. 1 will be mostly in the numerical format 1xx and elements on a FIG. 4 will be mostly in the numerical format 4xx.

As used herein, the term "substantially" in reference to a given parameter, property, or condition means and includes to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

As used herein, any relational term, such as "over," "under," "on," "underlying," "upper," "lower," etc., is used for clarity and convenience in understanding the disclosure and accompanying drawings and does not connote or depend on any specific preference, orientation, or order, except where the context clearly indicates otherwise.

It will be understood that when an element is referred to as being "on," "connected to," "coupled to," or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items.

The present disclosure describes methods and apparatus for improving memory subsystems by providing more balanced system bandwidth and enabling reduced complexity of the design and use of such interconnect systems.

FIG. 1 is a diagram of a data processing system 100 including a hybrid memory cube device 200 as an example of a device for operation on a memory bus using an abstracted memory protocol 130 to communicate with a data handling device 500. For ease of description, this disclosure focuses on HMC protocol buses. However, as those in the art having the benefit of this disclosure will appreciate, embodiments of the present disclosure may be practiced with other high-speed data buses that include an abstraction between devices holding the data and the protocol on the data bus.

The term "data handling device" 500 is used herein to distinguish devices on a memory bus that are configured mostly as consumers and generators of data, rather than devices for storing data, such as a DRAM memory. As non-limiting examples, data handling devices 500 can be considered processors (also referred to herein as processing devices), such as, for example, general purpose processors, special purpose processors, graphics processors, and digital signal processors. As another non-limiting example, data handling devices 500 can be considered communication devices. For example, a communication type data handling device 500 may be configured to convey data between a memory bus and some other type of communication bus, such as, for example, an Input/Output (IO) bus or a network bus. Of course, data handling devices 500 may also include both processor elements and communication elements. As such, the description herein may also describe a data handling device 500 as a System on a Chip (SoC) 500. Unless specifically stated otherwise, an SoC 500 as referred to herein should be considered equivalent to a data handling device 500. Finally, while data handling devices 500 may be considered to be focused on processing and moving data, they may also contain significant amounts of memory in the form of registers, buffers, caches, and other types of local memory on the SoC 500. Additional details of the SoC 500 are discussed below in combination with FIG. 5.

The hybrid memory cube device 200 (HMC 200) includes a logic base 400, which defines the abstracted memory protocol 130 to create memory links 120 between the SoC 500 and the HMC 200. A group of parallel buses 410 interface between the logic base 400 and a group of DRAMs 250 on the HMC 200. Additional details of the HMC 200 are discussed below in connection with FIGS. 2-4.

The memory links 120 are partitioned into upstream links headed toward the SoC 500 and downstream links headed away from the SoC 500. As part of the abstracted memory protocol 130, the memory links 120 are packetized as is explained more fully below. As a result, the memory links 120 are also referred to herein as packetized memory links 120 as well as hybrid memory cube links 120. Moreover, the packets conveyed on the memory links 120 are referred to as packet requests and packetized requests.

Figure 2:
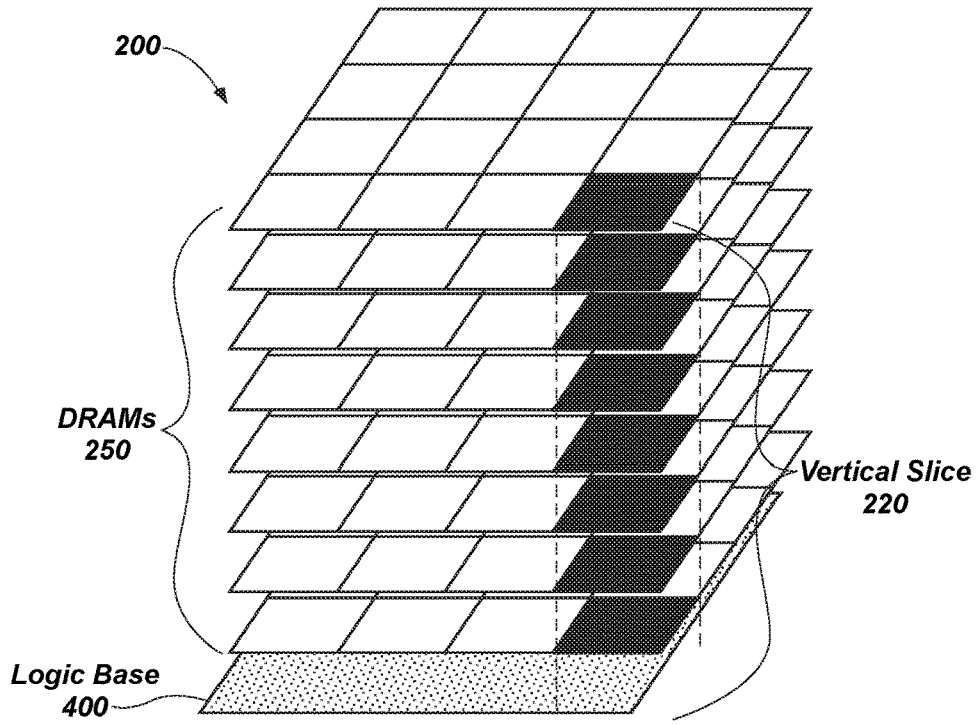
FIG. 2 illustrates possible partitioning of DRAMs in a hybrid memory cube.

FIG. 2 illustrates a possible partitioning of DRAMs 250 in the HMC 200. The HMC 200 may be considered as a 3-dimensional stack of DRAM die 250 coupled to the logic base 400. The logic base 400 may be configured as a separate die and configured to interface with the DRAM die 250. When stacked, interconnect between the various die may be accomplished with through silicon vias. While these devices may be physically configured as a 3-dimensional stack, they do not need to be so configured, but can still be thought of as 3-dimensional from an interconnect perspective.

Figure 3:
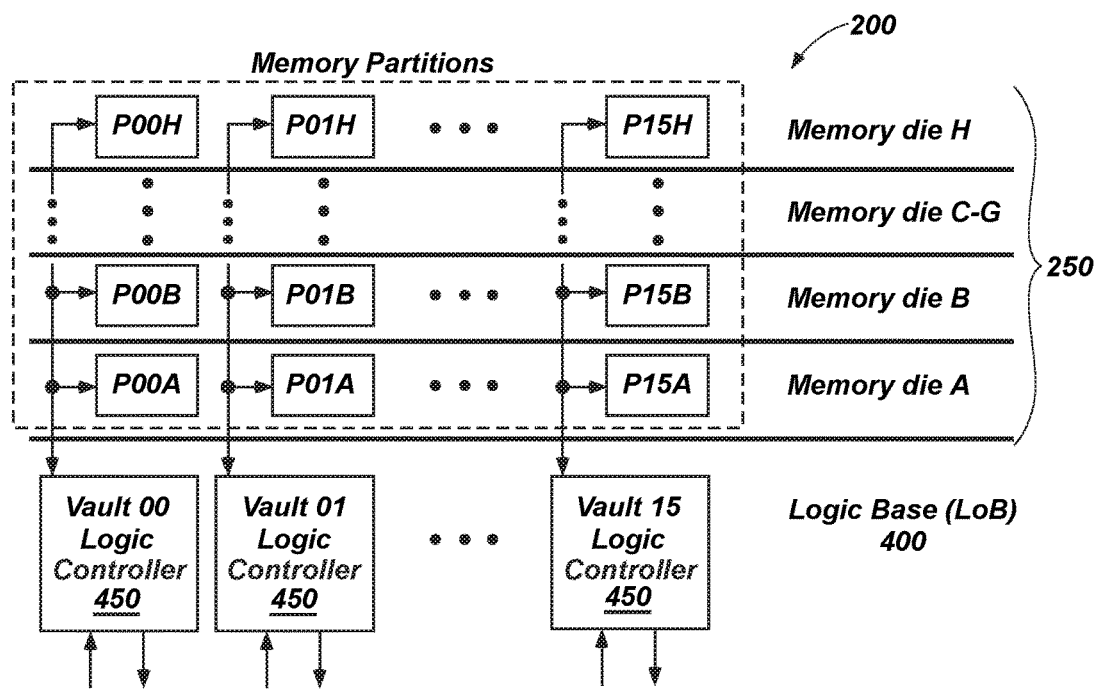
FIG. 3 illustrates a logical partitioning of DRAMs in a hybrid memory cube.

FIG. 3 illustrates a logical partitioning of DRAMs 250 in an HMC 200. Referring to FIGS. 2 and 3, the interconnection of multiple die layers enables a memory device with a combination of memory storage layers and one or more logic layers. In this manner, the device provides the physical memory storage and logical memory transaction processing in a single die package configured as the HMC 200. The end result is a very compact, power efficient package with available bandwidth capacity of up to 320 GB/s per device.

The HMC 200 is capable of such bandwidth via a hierarchical and parallel approach to the design. For example, device hierarchy may occur vertically across the logic layers and the hardware parallelism may occur across a given die layer. The logic base 400 includes multiple components that provide both external link access to the HMC 200 as well as internal routing and transaction logic.

The HMC 200 may be segmented into vertical slices 220 often referred to as "vaults 220." Each vault 220 may include vault controller 450 incorporated into the logic base 400 to control segments of the DRAMs 250 associated with that vault 220. The vault controller 450 manages memory reference operations to memory partitions within its vault 220. Each vault controller 450 may determine its own timing requirements and refresh operations, which allows different timing for each vault 220 and also eliminates the need for these functions in a host memory controller. In addition, a queue may be included with each vault controller 450 to buffer references for that vault's memory. The vault controllers 450 may execute references within their queue based on need rather than order of arrival. Therefore, responses from vault operations back to the external memory links 120 (FIG. 1) may be out of order in some cases.

The memory links 120 may be configured to provide four or eight logical links. Each link may be configured as a group of sixteen or eight serial and bidirectional I/O links. Devices configured with four links have the ability to operate at 10, 12.5 and 15 Gbps. Devices configured with eight links have the ability to operate at 10 Gbps.

Considering the hierarchical nature of the physical memory storage, the HMC specification defines a different physical addressing and interleave model than traditional banked DRAM devices. Physical addresses for HMC devices 200 are encoded into a 34-bit field that contain the vault, bank, and address bits. Rather than relying on a single addressing structure, the specification permits the implementer and user to define an address mapping scheme that is most optimized for the target memory access characteristics. It also provides a series of default address map modes that join the physical vault and bank structure to the desired maximum block request size. The default map schemas implement a low interleave model by mapping the less significant address bits to the vault address, followed immediately by the bank address bits. This method forces sequential addresses to first interleave across vaults then across banks within the vaults in order to avoid bank conflicts.

All in-band communication between host devices (e.g., SoCs 500) and HMC devices 200 are performed via a packetized format. This format includes three major packet classifications: request packets, response packets, and flow control packets. Packets may be configured as multiples of a single 16-byte flow unit (also referred to as a FLIT). Packet sizes may be as large as 9 FLITs (i.e., 144 bytes). A smallest packet may include only one 16-byte FLIT including a packet header and packet tail.

Memory read request packets for all memory payload sizes only require the packet header, packet tail, and the respective physical memory address. As such, read requests may be configured using a single FLIT. Memory read responses are separate packets that include the data from the address requested in the corresponding memory read packet. Write request and atomic request packets, however, must also contain the associated input data for write and read-modify-write operations, respectively. As such, these request types may have packet widths of 2-9 FLITs. The HMC specification defines a weak-ordering model between packets. As such, there may exist multiple packet reordering points present within a target implementation. Arriving packets that are destined for ancillary devices may pass those waiting for local vault access. Local vaults may also reorder queued packets in order to make most efficient use of bandwidth to and from the respective vault banks. However, reordering points present in a given HMC implementation may be defined to maintain the order of a stream of packets from a specific link to a specific bank within a vault. This ordering ensures that memory write requests followed by memory read requests deliver correct and deterministic behavior.

The link structure in the HMC 200 enables chaining of multiple HMCs 200 to enable the construction of memory subsystems that require capacities larger than a single HMC 200 device while maintaining the link structure and packetized transaction protocols. Additional details regarding the chaining are discussed below with reference to FIGS. 6-9.

Figure 4:
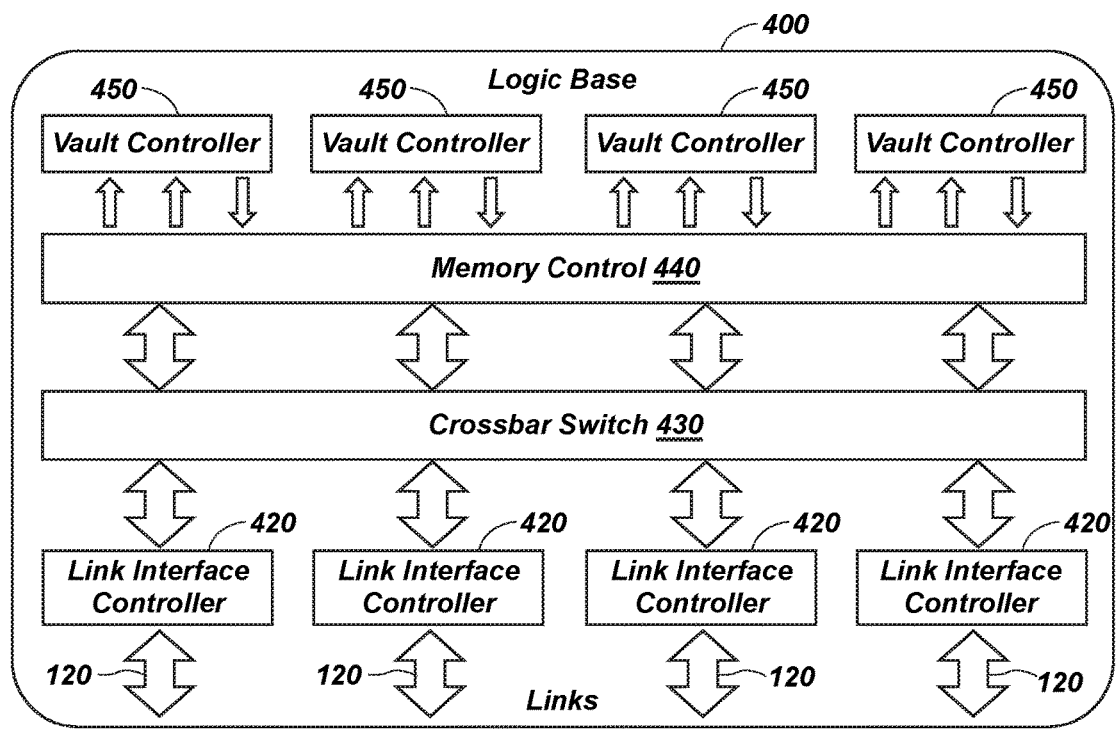
FIG. 4 illustrates a logic base for link interfaces and controlling the DRAMs in a hybrid memory cube.

FIG. 4 illustrates a logic base 400, which may be used for creating the link interfaces 120 and controlling the DRAMs 250 (FIGS. 1-3) in an HMC 200. The memory links 120, which include upstream links and downstream links, may be controlled by a link interface controller 420 for each memory link 120. Packets passed through the link interface controllers 420 may be passed through a crossbar switch 430. If a packet is destined for a vault on the HMC 200, the crossbar switch 430 may pass the packet to memory control logic 440. If a packet is destined for another HMC 200, the crossbar switch 430 may pass the packet to an appropriate link interface controller 420 to be sent on to the appropriate HMC 200. The memory control logic 440 and the vault logic 450 for the various vaults may combine to select the appropriate vault and appropriate timing for the selected vault.

Figure 5:
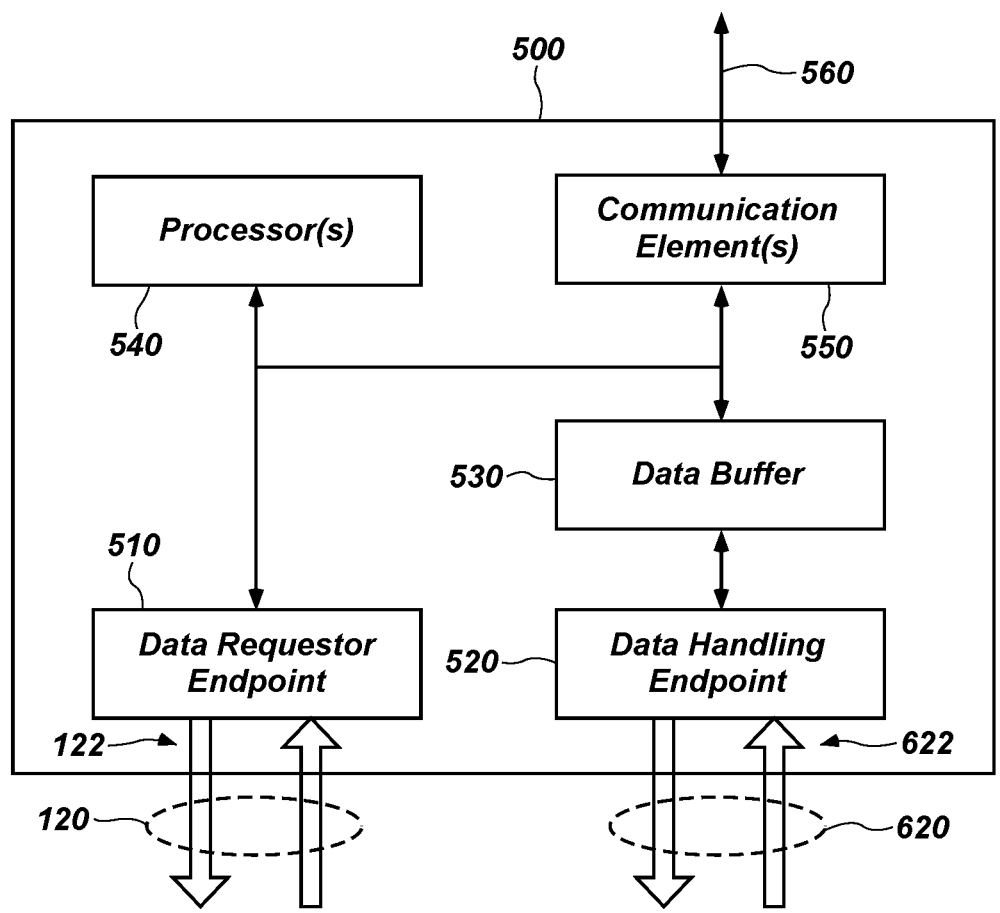
FIG. 5 illustrates some elements that may be present in a data handling device according to some embodiments of the present disclosure.

FIG. 5 illustrates some elements that may be present in a data handling device 500 according to some embodiments of the present disclosure. According to embodiments of the present disclosure, systems and methods may use HMC 200 devices and the memory interconnect protocols defined for HMC 200 as the basis for a more global system interconnect between multiple SoCs 500. Basic system interconnection capabilities using the HMC 200 device and link specification, thus consolidates the number, density, and heterogeneity of the outgoing links from a host system (e.g., an SoC 500).

Devices and systems constructed using the present disclosure may define system characteristics that are improvements over conventional multiprocessor system architectures. Some of these characteristics include high bandwidth memory and system interconnect links, balanced bandwidth and latency characteristics between locally connected memories and other system-level memories, latency minimization by reducing and/or eliminating protocol translations between local memory requests and system-level requests, and latency minimization by utilizing the efficient HMC 200 packet protocol for both local memory requests and system-level requests. The characteristics may also include maintaining atomicity between local memories and system-level memories over the HMC 200 system interconnect using the same protocol, support for a wide spectrum of system-level memory models (e.g., weak versus strong ordering), and support for cache coherency.

Figure 6:
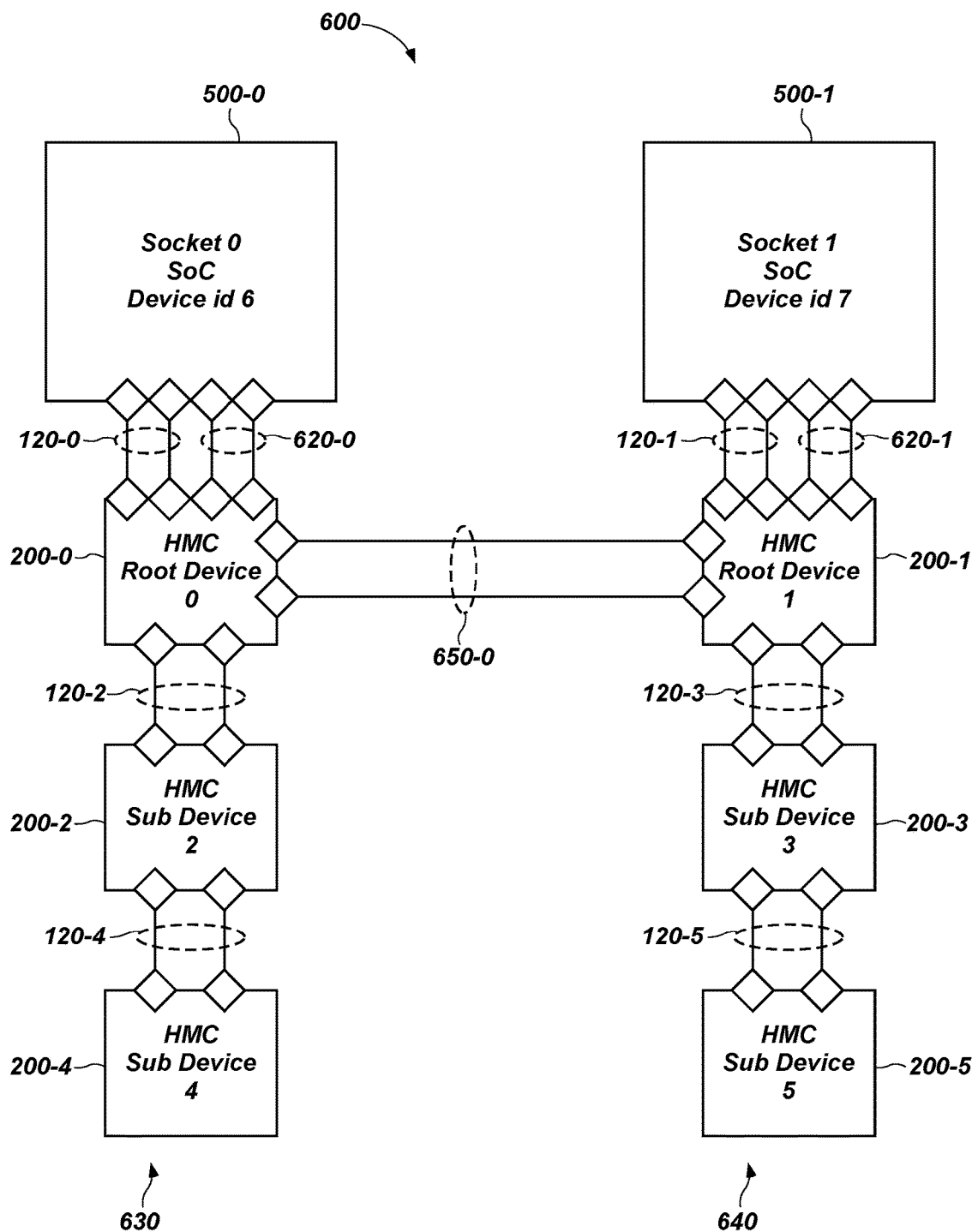
FIG. 6 illustrates a diagram of a system using in-situ routing between various data handling devices and memory devices and showing sparse routing between the memory devices.
Figure 7:
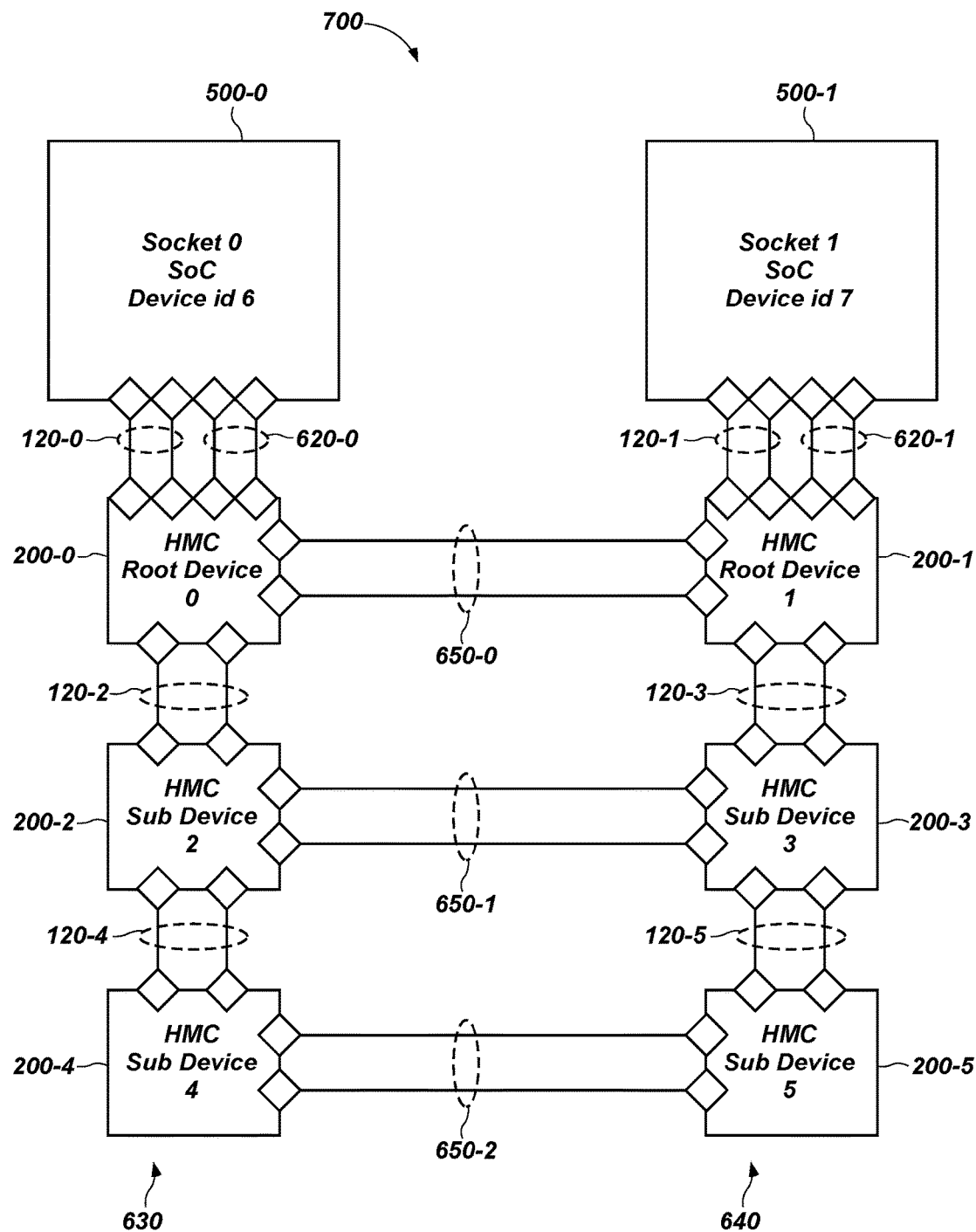
FIG. 7 illustrates a diagram of a system using in-situ routing between various data handling devices and memory devices and showing dense routing between the memory devices.
Figure 8:
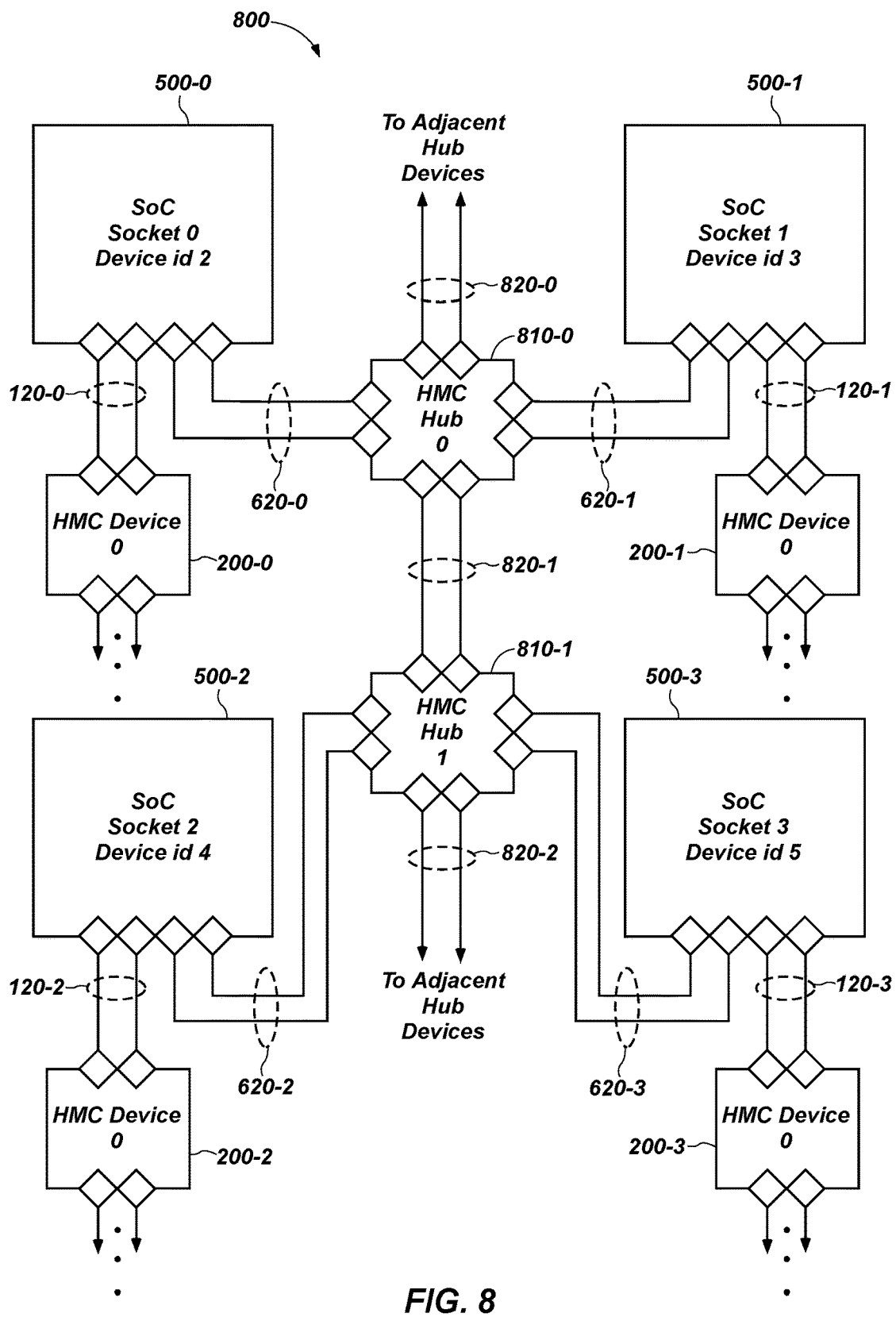
FIG. 8 illustrates a diagram of a system using dedicated routing between various data handling devices and memory devices.
Figure 9:
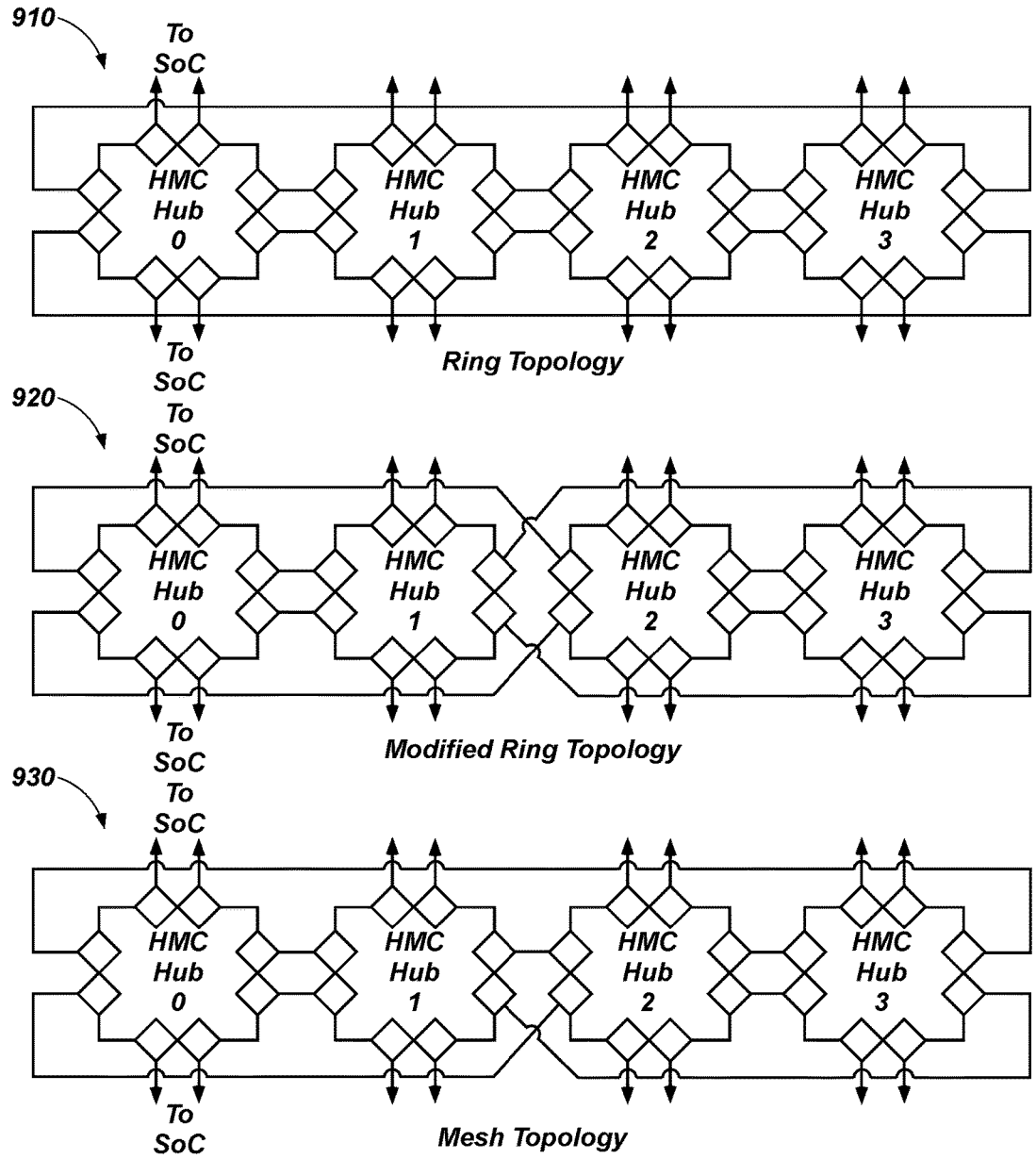
FIG. 9 illustrates various example topologies that may be used in systems with the dedicated routing of FIG. 8.

System configurations may generally be considered as including in-situ routing as shown in FIGS. 6 and 7 and dedicated routing as shown in FIGS. 8 and 9. The two potential implementations represent two different scalability models. The in-situ routing model provides efficient system-level scalability for multi-socket workstations, data center servers, and other basic infrastructure devices. The dedicated routing model provides efficient scalability beyond a small number of sockets. This scalability is analogous to building a large enterprise server or mainframe platforms. Both methodologies provide the ability to construct system architectures that are SoC-centric and support architectures that are Non-Uniform Memory Access (NUMA) in nature.

In both models, the SoC 500 presents an HMC "source" link to the HMC infrastructure. The source link may also be referred to herein as a second packetized memory link. With this second link, the SoC 500 inherits the ability to send and receive system link traffic. This extra link enables support of direct messaging from SoC to SoC. One example of such functionality is cache coherency traffic. For example, a system vendor may encode cache coherency requests (e.g., coherency lookups or invalidations) into HMC atomic request packets. One could also encode SoC 500 to SoC 500 messaging packets in the HMC base specification for read, write, posted read and posted write requests. This ability for system vendors to encode protocols in the HMC packet specification allows them to retain their respective intellectual property and provide high bandwidth, low latency system interconnect support.

Returning to FIG. 5, a conventional SoC 500 configured for an HMC interface may be as simple as one or more processor(s) 540 and a data requestor endpoint 510 coupled to a packetized memory link 120 (e.g., an HMC link 120) through a first hybrid memory cube interface 122. The data requestor endpoint 510 may also be referred to herein as a host requestor endpoint 510. Conventionally, a host only needs to make packet requests on an HMC 200 interface to perform functions such as, for example, memory reads, memory writes, and configuration definition packets.

Embodiments of the present disclosure, however, include a data handling endpoint 520 coupled to a second packetized memory link 620 through a second hybrid memory cube interface 622. Physically, and logically the second packetized memory link 620 is similar to a memory link on an HMC 200 device. In other words, the data handling endpoint 520 behaves similar to a memory endpoint. Thus, the data handling endpoint 520 interprets packet requests that look like memory reads, memory writes, or other configuration type packets, consumes data on memory writes and generates response packets of data for memory reads. With a data handling endpoint 520, systems can be created wherein the second packetized memory link 620 can be used as a system interconnection to other SoCs 500 and memory domains associated with the other SoCs 500. Thus, while the second packetized memory link 620 is physically and logically the same as the hybrid memory cube link 120, from an architectural perspective it can be treated as a link for conveying packetized system requests creating flexible and efficient system interconnections.

Moreover, since the data requestor endpoint 510 and the data handling endpoint 520 are similar, much of the logic design for the two endpoints can be reused rather than creating two separate buses with separate protocols as in conventional multi-processor systems.

As stated previously, an SoC 500 may be considered a processing device wherein the processors 540 could be implemented as a general purpose processor, a DSP, a special purpose processor, a graphics process, or a combination thereof. However, the SoC 500 may also be implemented primarily as a communication device. In such an implementation one or more communication elements 550 may be included to translate packets from the data handling endpoint 520 to another bus 560. This other bus 560 may be, for example, a bus to an I/O hub, another communication device, storage devices, a network, or combinations thereof. Of course, the SoC 500 may include both processors 540 and communication elements 550. Thus, processors 540 and communication elements 550 may be referred to generically as data handling elements (540, 550).

Since the data handling endpoint 520 behaves similar to a memory endpoint, packets handled by the data handling endpoint 520 have addresses associated with them and data may be conveyed in large bursts. In some embodiments, the processors 540 and/or communication elements 550 may have memory associated with them with their own addresses such that data can be conveyed directly between the data handling endpoint 520 and the appropriate data handling elements (540, 550).

Other embodiments may include a data buffer 530 for defining an address space for link requests to the data handling device 500. With the data buffer 530 a separate dedicated address space can be defined and the data buffer 530 can collect data before passing it on the appropriate data handling elements (540, 550). The data buffer 530 may be configured as a Direct Memory Access (DMA) buffer or a (First In First Out) FIFO buffer that permits SoCs 500 to send traffic asynchronously to one another. The respective size of the data buffer 530 may be determined by the number and frequency of the associated HMC link 620.

In addition, the SoC 500 may be configured such that the data requestor endpoint 510 can handle requests to that endpoint in a manner similar to the data handling endpoint 520. Similarly, the data handling endpoint 520 can be configured to originate requests from the data handling elements (540, 550) in a manner similar to the data requestor endpoint 510.

Thus, in a data handling device the data requestor endpoint is configured for originating first packet requests on a first packetized memory link. The data handling endpoint is configured for interpreting second packet requests to the data handling endpoint on a second packetized memory link and conveying data bidirectionally across the second packetized memory link in response to the second packet requests. In addition, the first packetized memory link and the second packetized memory link are separate but include a same type of link protocol and a same type of physical interface.

In another embodiment of a data handling device, a first hybrid memory cube link is operably coupled to a host requestor endpoint on the data handling device, the host requestor endpoint is for originating packetized memory requests to a local memory domain including one or more hybrid memory cube devices. A second hybrid memory cube link is operably coupled to a data handling endpoint on the data handling device, the data handling endpoint is for interpreting packetized system requests from an additional data handling device operably coupled to at least one of the one or more hybrid memory cube devices.

In another embodiment, a method of conveying data with a data handling device includes using the data handling device to originate packetized memory requests on a first hybrid memory cube link to a hybrid memory cube device in a first memory domain associated with the data handling device. The method also includes using the data handling device to receive packetized system requests on a second hybrid memory cube link, wherein the packetized system request originates from a second data handling device (not shown in FIG. 5). The method also includes responding to the packetized system requests.

FIG. 6 illustrates a diagram of a system 600 using in-situ routing between various data handling devices 500 and memory devices 200 and showing sparse routing between the memory devices 200. As stated earlier, multiple HMC devices 200 may be chained together to increase the total memory capacity available to an SoC 500. In a conventional single processor/HMC system, each HMC 200 is identified through the value in a 3-bit chip ID field in the request packet header. The 3-bit chip ID field may also be referred to herein as a CUB field or a device ID. Thus, a network of up to eight HMC devices 200 may be supported for the processor.

Various topologies for interconnection of HMCs 200 are supported and the routing to different HMCs 200 can be complex and include multiple paths. Thus, a host processor is usually in control of the routing topologies and loads routing configuration information into each HMC 200 to determine how packets that are not for that HMC 200 should be routed to other links on the HMC 200. This routing information enables each HMC 200 to use the CUB field to route request packets to the proper destination. As a result, when an HMC 200 processes a packet that is not destined for itself, the HMC 200 chains and passes the packet through to another link on the HMC 200 to be sent to another HMC 200.

The in-situ routing configuration provides system interconnect routing capabilities for a small number of system devices. More specifically, the total number of system devices is gated by the total number of HMC devices 200 present in the system architecture. This limitation follows the base HMC specification's notion that the CUB field is limited to three bits of address field space, which maps to eight total HMC endpoints. In the case of in-situ routing, the CUB field is used to denote one or more SoC endpoints. Thus, each SoC 500 and all HMC devices 200 receive a unique CUB identifier for the purpose of routing request traffic between SoC 500 and HMC 200, HMC 200 and HMC 200 or SoC 500 and SoC 500.

In FIG. 6, each of the HMC devices (200-0 through 200-5) are defined with a corresponding device ID 0-5. In addition, a first SoC 500-0 in a socket 0 is defined with a device ID 6 and a second SoC 500-1 in a socket 1 is defined with device ID 7.

The in-situ routing configuration can be thought of as having three different types of links. The first link type may be identified as SoC source links 620-0 and 620-1. These SoC source links (620-0, 620-1) may also be referred to as second packetized memory links 620 and second hybrid memory cube links 620, as described above with reference to FIG. 5.

These SoC source links (620-0, 620-1) serve to receive request traffic on the SoC (500-0, 500-1) at its data handling endpoint 520. The SoC source links (620-0, 620-1) permit SoCs (500-0, 500-1) to communicate directly without intermediate double buffering in a main memory space. In this manner, the SoCs (500-0, 500-1) will appear as both an HMC source through the data handling endpoint 520 and an HMC requestor through the data requestor endpoint 510.

The second and third link types map to traditional HMC configurations. The second link type (i.e., an inter-domain memory link 650-0) provides the ability to route traffic across HMC links to neighboring memory domains such as a first memory domain 630 and a second memory domain 640. In other words, the inter-domain memory link 650-0 serves as a bridge between memory domains. Depending upon the target system cost model, system architects can choose the number of links that bridge the gap between the respective NUMA domains using these system links. FIG. 6 illustrates a sparse routing because there is only one inter-domain memory link 650-0.

FIG. 7 illustrates a diagram of a system 700 using in-situ routing between various data handling devices 500 and memory devices 200 and showing dense routing between the memory devices. In FIG. 7, the system is densely routed because there are three inter-domain memory links 650-0, 650-1, and 650-2. The densely connected system architecture provides the ability to configure the memory to memory domain topology to create multiple routing paths in order to reduce link hot spotting. Other than the inter-domain memory links 650-0, 650-1, and 650-2, FIG. 7 is similar to FIG. 6 and the elements need not be described again.

The third link type is local request links 120 that routes memory traffic for each of the local memory domains, respectively. These links are denoted as 120-0 through 120-5. These links provide traditional HMC 200 memory traffic within a memory domain.

FIGS. 6 and 7 illustrate fully populated systems 600, 700, respectively. In other words every device ID for the current version of the HMC specification is used. Other systems may be used that expand on the device ID. For example, the addition of a single bit to the device ID could expand the number of devices from 8 to 16 and could include any combination of SoCs 500 and HMCs 200.

In addition, systems may be defined that are sparsely populated. For example, while not illustrated, a system could include the socket 0 SoC 500-0, the socket 1 SoC 500-1 and a single HMC 200 (e.g., HMC 200-0). In such a system, the SoC source link 620-1 on the SoC 500-1 may be connected directly to a link on the HMC 200-0 and the local memory link 120-1 on the SoC 500-1 may be connected directly to another link on the HMC 200-0. As a result, packets can still be passed between SoC 500-0 and SoC 500-1 and the two SoCs 500-0 and 500-1 can share access to the memory in HMC 200-0.

Thus, the data processing system includes two or more data handling devices and a hybrid memory cube device. Each data handling device includes a host requestor endpoint configured for originating first packet requests on a first packetized memory link. Each data handling devices also includes a data handling endpoint configured for receiving and responding to second packet requests to the data handling endpoint on a second packetized memory link. The hybrid memory cube device is associated with a first memory domain corresponding to one of the two or more data handling devices. The hybrid memory cube device is configured to chain and pass the second packet requests between two of the two or more data handling devices.

In another embodiment, a method of conveying data in a system includes originating memory requests from a host requestor endpoint on a first data handling device. The method also includes sending the memory requests on a first packetized memory link coupled to the first data handling device to a first hybrid memory cube in a first memory domain associated with the first data handling device. The method also includes receiving system requests at the first hybrid memory cube wherein the system requests are from a second data handling device. The method also includes passing the system requests from the first hybrid memory cube to a data handling endpoint on the first data handling device via a second packetized memory link coupled to the first data handling device. In some embodiments with a second hybrid memory cube, the method may further include originating the system requests from the host requestor endpoint on the second data handling device and before receiving the system request at the first hybrid memory cube, receiving the system requests at the second hybrid memory cube and passing the system requests from the second hybrid memory cube to the first hybrid memory cube.

FIG. 8 illustrates a diagram of a system 800 using dedicated routing between various data handling devices 500 and memory devices 200. The dedicated routing configuration permits larger, more scalable system architectures to be constructed. As with the in-situ routing configuration, dedicated routing includes SoCs 500 that can serve both as an HMC requestor through the data requestor endpoint 510 and appear as a target endpoint through the data handling endpoint 520. However, in the dedicated routing configuration, the HMC request traffic is split into two domains from the perspective of any given SoC 500. Each SoC 500 contains both a local domain and a system domain. Each domain has the ability to support up to eight endpoints (based upon the aforementioned CUB field limitations). In this manner, each SoC 500 has the ability to support up to eight HMC devices that are locally connected in its local domain. Endpoints in the local domain are generally HMC memory devices 200. FIG. 8 illustrates local domain links as 120-0 through 120-3. Thus, in FIG. 8 there is only one HMC (200-0 through 200-3) associated with each SoC (500-0 through 500-3). However, dedicated routing systems can be configured with up to 8 HMC devices 200 in the local domain of each SoC (500-0 through 500-3).

The system domain provides functionality for system level traffic routing. Each SoC (500-0 through 500-3) provides the ability to route system request traffic over the system domain. Endpoints in the system domain can be SoCs 500, HMC devices 200 used as hubs and HMC devices 200 used as memory storage. The scalability of the system is determined by the ratio of HMC router devices to SoC endpoints.

As one example, FIG. 8 illustrates a dedicated routing system with two HMC hubs (810-0 and 810-1). The HMC hubs (810-0 and 810-1) include links coupled to the second packetized memory links (620-0 through 620-3) of each SoC (500-0 through 500-3). In addition FIG. 8 illustrates inter-hub links (820-0 through 820-2) for coupling the HMC hubs (810-0 and 810-1) together and to adjacent hub devices.

FIG. 8 illustrates a system that is not fully populated in the system domain. The HMC hubs (810-0 and 810-1) use device IDs 0 and 1 respectively and the SoCs (500-0 through 500-3) use device IDs 2-5 respectively. Thus, as one example, another SoC 500 may be coupled to inter-hub link 820-0 and given a device ID of 6 and another SoC 500 may be coupled to inter-hub link 820-1 and given a device ID of 7. As another example, another HMC hub 810 may be coupled to inter-hub link 820-1 and given a device ID of 6 and another SoC 500 may be coupled to that other HMC hub 810 and given a device ID of 7.

The system interconnect in the dedicated routing architecture may be expanded in other ways. For example, as with the in-situ routing additional bits could be added to the device ID field. For example, the addition of a single bit to the device ID could expand the number of devices from 8 to 16 and could include any combination of SoCs 500 and HMC hubs 810. As another example, additional packetized link buses similar to the first packetized link 120 and the second packetized link 620 could be added to open up another completely new domain.

Also, the local memory domains for each SoC 500 could be more complex than just including HMC 200 memory devices. The local domain could be configured with an in-situ routing architecture as discussed above with reference to FIGS. 5-7.

Thus, in a dedicated routing configuration, a data processing system includes two or more data handling devices. Each data handling device includes a host requestor endpoint configured for originating local memory packet requests on a first packetized memory link and a data handling endpoint configured for receiving and responding to second packet requests to the data handling endpoint on a second packetized memory link. The data processing system also includes one or more hybrid memory cube hubs. Each of the hybrid memory cube hubs include a first packetized memory link operably coupled to the data handling endpoint of one of the two or more data handling devices and a second packetized memory link operably coupled to the data handling endpoint of another of the two or more data handling devices.

In another embodiment of a dedicated routing configuration, a method of conveying data in a system includes originating memory requests from a host requestor endpoint on a first data handling device and sending the memory requests on a first packetized memory link coupled to the first data handling device to a first hybrid memory cube in a first memory domain associated with the first data handling device. The method also includes originating system requests from a data handling endpoint on the first data handling device and sending the system requests on a second packetized memory link coupled to the first data handling device to a hybrid memory cube hub. The method also includes passing some of the system requests from the hybrid memory cube hub 810-0 to a second data handling device.

FIG. 9 illustrates various example topologies that may be used in systems with the dedicated routing of FIG. 8. The dedicated routing methodology also provides the ability to construct much more complex system architectures with different topological advantages. As non-limiting examples, topologies of system domains can be constructed using rings 910, modified rings 920, meshes 930 and crossbars (not shown). The eventual topological determination may be made based upon required bandwidth and latency characteristics weighed against the target system cost.

The embodiments of the disclosure described above and illustrated in the accompanying drawing figures do not limit the scope of the invention, since these embodiments are merely examples of embodiments of the disclosure. The invention is defined by the appended claims and their legal equivalents. Any equivalent embodiments lie within the scope of this disclosure. Indeed, various modifications of the present disclosure, in addition to those shown and described herein, such as alternative useful combinations of the elements described, will become apparent to those of ordinary skill in the art from the description. Such modifications and embodiments also fall within the scope of the appended claims and their legal equivalents.

What is claimed is:

1. A method of conveying data with a data handling device, the method comprising:
   on a first data handling device:
      originating packetized memory requests on a first hybrid memory cube link to a first hybrid memory cube device in a first memory domain associated with the first data handling device;
      receiving packetized system requests on a second hybrid memory cube link originating from a second data handling device in a second memory domain;
      responding to the packetized system requests: and
      originating packetized system requests on the second hybrid memory cube link of the first data handling device to the second data handling device, wherein packetized memory requests sent and received on the second hybrid memory cube link between the first data handling device to the second data handling device are passed through the first hybrid memory cube device in the second memory domain associated with the second data handling device.

2. The method of claim 1, further comprising buffering data received with the packetized system requests on the first data handling device to define an address space for the packetized system requests to the first data handling device.

3. The method of claim 1, further comprising buffering read data to be sent when responding to the packetized system requests to define an address space on the first data handling device.

4. The method of claim 1, wherein packetized memory requests sent and received on the second hybrid memory cube link between the first data handling device to the second data handling device are further passed through a second hybrid memory cube device in the second memory domain associated with the second data handling device.

5. The method of claim 1, wherein packetized memory requests sent and received on the second hybrid memory cube link between the first data handling device to the second data handling device are passed through a first hybrid memory cube hub between the first data handling device and the second data handling device.

6. The method of claim 5, further comprising passing some packetized memory requests to additional data handling devices.

7. The method of claim 5, wherein passing some packetized memory requests to additional data handling devices occur through a second hybrid memory cube hub coupled to the first hybrid memory cube hub via an inter-hub link.

8. The method of claim 1, further comprising passing some of the packetized memory requests from the first hybrid memory cube in the first memory domain to another hybrid memory cube in the first memory domain.

9. The method of claim 1, wherein originating the packetized memory requests on the first hybrid memory cube link occurs through a data requestor endpoint of the first data handling device.

10. The method of claim 9, wherein receiving the packetized system requests on the second hybrid memory cube link occurs through a data handling endpoint of the first data handling device that is separate from the data requestor endpoint.

11. The method of claim 1, wherein originating packetized system requests on the second hybrid memory cube link of the first data handling device to the second data handling device includes cache coherency traffic.

12. The method of claim 11, further comprising encoding cache coherency requests into hybrid memory cube atomic request packets.

13. A method of conveying data with a data handling device, the method comprising:
on a first data handling device:
originating packetized memory requests on a first hybrid memory cube link to a first hybrid memory cube device in a first memory domain associated with the first data handling device;
receiving packetized system requests on a second hybrid memory cube link originating from a second data handling device in a second memory domain; and
responding to the packetized system requests,
wherein packetized memory requests sent and received on the second hybrid memory cube link between the first data handling device to the second data handling device are passed through a first hybrid memory cube hub between the first data handling device and the second data handling device, wherein passing some packetized memory requests to additional data handling devices occur through a second hybrid memory cube hub coupled to the first hybrid memory cube hub via an inter-hub link, and wherein packetized memory requests sent and received on the second hybrid memory cube link between the first data handling device to the second data handling device are passed through one or more inter-domain memory cube links between one or more additional hybrid memory cube devices in the first memory domain and one or more additional hybrid memory cube devices in the second memory domain.

14. The method of claim 13, further comprising passing some of the system requests from the second hybrid memory cube hub to one or more additional memory cube hubs.

15. The method of claim 14, wherein the one or more additional memory cube hubs are arranged according to a ring topology.

16. The method of claim 14, wherein the one or more additional memory cube hubs are arranged according to a modified ring topology.

17. The method of claim 14, wherein the one or more additional memory cube hubs are arranged according to a mesh topology.

18. A method of conveying data with a data handling device, the method comprising:
on a first data handling device:
originating packetized memory requests on a first hybrid memory cube link to a first hybrid memory cube device in a first memory domain associated with the first data handling device;
receiving packetized system requests on a second hybrid memory cube link originating from a second data handling device in a second memory domain;
responding to the packetized system requests; and
originating packetized system requests on the second hybrid memory cube link of the first data handling device to the second data handling device, wherein originating packetized system requests on the second hybrid memory cube link of the first data handling device to the second data handling device includes encoding protocols in messaging packet specifications for read, write, posted read, and posted write requests.

* * * * *

UNITED STATES PATENT AND TRADEMARK OFFICE
CERTIFICATE OF CORRECTION

PATENT NO. : 10,126,947 B2
APPLICATION NO. : 15/413732
DATED : November 13, 2018
INVENTOR(S) : John D. Leidel It is certified that error appears in the above-identified patent and that said Letters Patent is hereby corrected as shown below:

In the Claims
Claim 1, Column 14, Line 12, change "system requests: and" to --system requests; and--

Signed and Sealed this
First Day of January, 2019

Andrei Iancu
*Director of the United States Patent and Trademark Office*